(12) United States Patent
Yaguchi et al.

(10) Patent No.: US 12,382,688 B2
(45) Date of Patent: Aug. 5, 2025

(54) SEMICONDUCTOR APPARATUS AND METHOD FOR MANUFACTURING SEMICONDUCTOR APPARATUS

(71) Applicant: FUJI ELECTRIC CO., LTD., Kanagawa (JP)

(72) Inventors: Shuntaro Yaguchi, Matsumoto (JP); Takashi Yoshimura, Matsumoto (JP); Hiroshi Takishita, Matsumoto (JP); Misaki Uchida, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 414 days.

(21) Appl. No.: 17/970,501

(22) Filed: Oct. 20, 2022

(65) Prior Publication Data

US 2023/0041042 A1 Feb. 9, 2023

Related U.S. Application Data

(63) Continuation of application No. PCT/JP2021/041540, filed on Nov. 11, 2021.

(30) Foreign Application Priority Data

Nov. 11, 2020 (JP) ................................ 2020-188351

(51) Int. Cl.
*H10D 12/00* (2025.01)
*H01L 21/265* (2006.01)
(Continued)

(52) U.S. Cl.
CPC ....... *H10D 62/60* (2025.01); *H01L 21/26506* (2013.01)

(58) Field of Classification Search
CPC ...... H10D 62/60; H10D 62/129; H10D 8/422; H10D 12/481; H10D 62/127; H10D 64/117; H01L 21/26506
See application file for complete search history.

(56) References Cited

U.S. PATENT DOCUMENTS 11,342,186 B2 * 5/2022 Agata ................. H10D 8/422
2014/0246755 A1 9/2014 Yoshimura
(Continued)

FOREIGN PATENT DOCUMENTS

DE 112015006631 T5 3/2018
DE 112019001123 T5 11/2020
(Continued)

OTHER PUBLICATIONS (ISA/237) Written Opinion of the International Search Authority for International Patent Application No. PCT/JP2021/041540, issued/mailed by the Japan Patent Office on Feb. 28, 2022.
(Continued)

*Primary Examiner* — David Vu

(57) ABSTRACT

Provided is a semiconductor apparatus, wherein a doping concentration distribution in the buffer region has a deepest slope where a doping concentration monotonically decreases to a position where it comes in contact with the drift region in a direction from the lower surface of the semiconductor substrate toward an upper surface, a hydrogen chemical concentration distribution in the buffer region includes in a first depth range provided with the slope: a first decrease portion where a hydrogen chemical concentration decreases toward the upper surface side; a second decrease portion located closer to the upper surface side than the first decrease portion is and where the chemical concentration decreases; and an intermediate portion arranged between the first and second decrease portions, and the intermediate portion has: a flat portion where the distribution is uniform; a peak in a slope of the chemical concentration; or a kink portion of the chemical concentration.

14 Claims, 13 Drawing Sheets

(51) Int. Cl.
 *H10D 62/10* (2025.01)
 *H10D 62/60* (2025.01)

(56) References Cited

U.S. PATENT DOCUMENTS

| | | |
|---|---|---|
| 2018/0005829 A1 | 1/2018 | Takishita |
| 2018/0040691 A1 | 2/2018 | Breymesser |
| 2018/0053655 A1 | 2/2018 | Kawase |
| 2019/0066977 A1 | 2/2019 | Jelinek |
| 2019/0385852 A1 | 12/2019 | Jelinek |
| 2021/0082702 A1 | 3/2021 | Agata |

FOREIGN PATENT DOCUMENTS

| | | |
|---|---|---|
| JP | 2018078324 A | 5/2018 |
| WO | 2016203545 A1 | 12/2016 |
| WO | 2017047276 A1 | 3/2017 |
| WO | 2020080295 A1 | 4/2020 |

OTHER PUBLICATIONS

Office Action issued for counterpart German Application 112021001383.1, transmitted from the German Patent and Trademark Office on Sep. 4, 2024 (issued on Aug. 28, 2024).

\* cited by examiner

SEMICONDUCTOR APPARATUS AND METHOD FOR MANUFACTURING SEMICONDUCTOR APPARATUS

The contents of the following Japanese patent application(s) are incorporated herein by reference:
NO. 2020-188351 filed in JP on Nov. 11, 2020
NO. PCT/JP2021/041540 filed in WO on Nov. 11, 2021

BACKGROUND

1. Technical Field

The present invention relates to a semiconductor apparatus and a method for manufacturing a semiconductor apparatus.

2. Related Art

In the related art, a configuration in which a buffer layer (a field stop layer) is provided in a semiconductor apparatus such as an IGBT (an insulated-gate bipolar transistor) is known (for example, refer to Patent Document 1).
Patent Document 1: WO2016/203545

DESCRIPTION OF EXEMPLARY EMBODIMENTS

Figure 1:
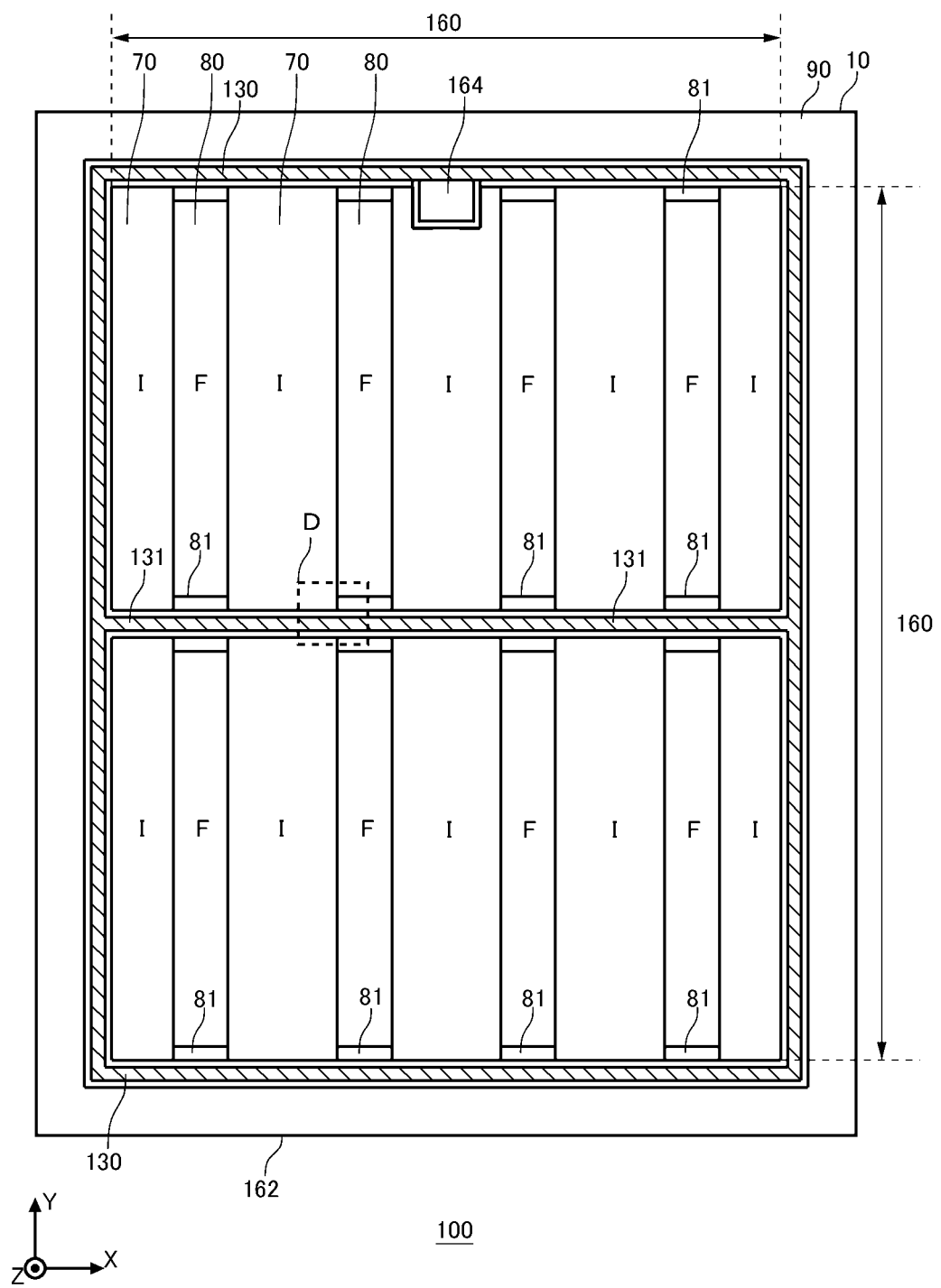
FIG. 1 illustrates a top view showing one example of a semiconductor apparatus 100.

Hereinafter, the invention will be described through embodiments of the invention, but the following embodiments do not limit the invention according to claims.

In addition, not all of the combinations of features described in the embodiments are essential to the solving means of the invention.

As used herein, one side in a direction parallel to a depth direction of a semiconductor substrate is referred to as "upper" and the other side is referred to as "lower". One surface of two principal surfaces of a substrate, a layer or other member is referred to as an upper surface, and the other surface is referred to as a lower surface. "Upper" and "lower" directions are not limited to a direction of gravity, or a direction in which a semiconductor apparatus is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction.

Further, a region from a center of the semiconductor substrate in the depth direction to the upper surface of the semiconductor substrate may be referred to as an upper surface side. Similarly, a region from the center of the semiconductor substrate in the depth direction to the lower surface of the semiconductor substrate may be referred to as a lower surface side. In the present specification, a center position of the semiconductor substrate in the depth direction may be referred to as Zc.

In the present specification, a case where a term such as "same" or "equal" is mentioned may include a case where an error due to a variation in manufacturing or the like is included. The error is, for example, within 10%.

In the present specification, a conductivity type of a doping region where doping has been carried out with an impurity is described as a P type or an N type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking into account of polarities of charges. As an example, when the donor concentration is $N_D$ and the acceptor concentration is $N_A$, the net doping concentration at any position is given as $N_D$-$N_A$. In the present specification, the net doping concentration may be simply referred to as the doping concentration.

The donor has a function of supplying electrons to a semiconductor. The acceptor has a function of receiving electrons from the semiconductor. The donor and the acceptor are not limited to the impurities themselves. For example, a VOH defect which is a combination of a vacancy (V), oxygen (O), and hydrogen (H) existing in the semiconductor functions as the donor that supplies electrons. In the present specification, the VOH defect may be referred to as a hydrogen donor.

In the present specification, a description of a P+ type or an N+ type means a higher doping concentration than that of the P type or the N type, and a description of a P− type or an N− type means a lower doping concentration than that of the P type or the N type. Further, in the specification, a description of a P++ type or an N++ type means a higher doping concentration than that of the P+ type or the N+ type. In the present specification, a unit system is the SI base unit system unless otherwise noted. Although a unit of a length may be represented by centimeters, various calculations may be performed after conversion to meters (m).

A chemical concentration in the present specification indicates an atomic density of an impurity measured regardless of an electrical activation state. The chemical concentration (an atomic density) can be measured by, for example, secondary ion mass spectrometry (SIMS). The net doping concentration described above can be measured by voltage-capacitance profiling (CV profiling). Further, a carrier concentration measured by spreading resistance profiling (SRP method) may be set as the net doping concentration. The carrier concentration measured by the CV profiling or the SRP method may be a value in a thermal equilibrium state. Further, in a region of the N type, the donor concentration is sufficiently higher than the acceptor concentration, and thus the carrier concentration of the region may be set as the donor concentration. Similarly, in a region of the P type, the carrier concentration of the region may be set as the acceptor concentration. In the present specification, the doping concentration of the N type region may be referred to as the donor concentration, and the doping concentration of the P type region may be referred to as the acceptor concentration.

Further, when a concentration distribution of the donor, acceptor, or net doping has a peak in a region, a value of the peak may be set as the concentration of the donor, acceptor, or net doping in the region. In a case where the concentration of the donor, acceptor or net doping is substantially uniform in a region, or the like, an average value of the concentration of the donor, acceptor or net doping in the region may be set as the concentration of the donor, acceptor or net doping. In the present specification, atoms/cm$^3$ or /cm$^3$ is used to indicate a concentration per unit volume. This unit is used for the donor or acceptor concentration, or the chemical concentration in the semiconductor substrate. A notation of the atoms may be omitted.

The carrier concentration measured by the SRP method may be lower than the concentration of the donor or the acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of the donor or the acceptor calculated from the carrier concentration measured by the CV profiling or the SRP method may be lower than a chemical concentration of an element indicating the donor or the acceptor. As an example, in a silicon semiconductor, a donor concentration of phosphorous or arsenic serving as a donor, or an acceptor concentration of boron (boron) serving as an acceptor is approximately 99% of chemical concentrations of these. On the other hand, in the silicon semiconductor, a donor concentration of hydrogen serving as a donor is approximately 0.1% to 10% of a chemical concentration of hydrogen. Each concentration in the present specification may be a value at room temperature. As the value at room temperature, a value at 300 K (Kelvin) (about 26.9° C.) may be used as an example FIG. 1 illustrates a top view showing one example of a semiconductor apparatus 100. FIG. 1 shows a position at which each member is projected on an upper surface of a semiconductor substrate 10. FIG. 1 shows merely some members of the semiconductor apparatus 100, and omits illustrations of some members.

The semiconductor apparatus 100 includes the semiconductor substrate 10. The semiconductor substrate 10 is a substrate that is formed of a semiconductor material. As an example, the semiconductor substrate 10 is a silicon substrate, but a material of the semiconductor substrate 10 is not limited to silicon.

The semiconductor substrate 10 has an end side 162 in the top view. When the top view is merely mentioned in the present specification, it means that the semiconductor substrate 10 is viewed from an upper surface side. The semiconductor substrate 10 of this example has two sets of end sides 162 opposite to each other in the top view. In FIG. 1, the X axis and the Y axis are parallel to any of the end sides 162. In addition, the Z axis is perpendicular to the upper surface of the semiconductor substrate 10.

The semiconductor substrate 10 is provided with an active portion 160. The active portion 160 is a region where a main current flows in the depth direction between the upper surface and a lower surface of the semiconductor substrate 10 when the semiconductor apparatus 100 operates. An emitter electrode is provided above the active portion 160, but is omitted in FIG. 1.

The active portion 160 is provided with at least one of a transistor portion 70 including a transistor element such as an IGBT, and a diode portion 80 including a diode element such as a freewheeling diode (FWD). In the example of FIG. 1, the transistor portion 70 and the diode portion 80 are alternately arranged along a predetermined array direction (the X axis direction in this example) on the upper surface of the semiconductor substrate 10. The active portion 160 in another example may be provided with only one of the transistor portion 70 and the diode portion 80.

In FIG. 1, a region where each of the transistor portions 70 is arranged is indicated by a symbol "I", and a region where each of the diode portions 80 is arranged is indicated by a symbol "F". In the present specification, a direction perpendicular to the array direction in the top view may be referred to as an extending direction (the Y axis direction in FIG. 1). Each of the transistor portions 70 and the diode portions 80 may have a longitudinal length in the extending direction. In other words, the length of each of the transistor portions 70 in the Y axis direction is larger than the width in the X axis direction. Similarly, the length of each of the diode portions 80 in the Y axis direction is larger than the width in the X axis direction. The extending direction of the transistor portion 70 and the diode portion 80, and the longitudinal direction of each trench portion described later may be the same.

Each of the diode portions 80 includes a cathode region of the N+ type in a region in contact with the lower surface of the semiconductor substrate 10. In the present specification, a region where the cathode region is provided is referred to as the diode portion 80. In other words, the diode portion 80 is a region that overlaps with the cathode region in the top view. On the lower surface of the semiconductor substrate 10, a collector region of the P+ type may be provided in a region other than the cathode region. In the specification, the diode portion 80 may also include an extension region 81 where the diode portion 80 extends to a gate runner described below in the Y axis direction. The collector region is provided on a lower surface of the extension region 81.

The transistor portion 70 has the collector region of the P+ type in a region in contact with the lower surface of the semiconductor substrate 10. Further, in the transistor portion 70, an emitter region of the N type, a base region of the P type, and a gate structure having a gate conductive portion and a gate dielectric film are periodically arranged on the upper surface side of the semiconductor substrate 10.

The semiconductor apparatus 100 may have one or more pads above the semiconductor substrate 10. The semiconductor apparatus 100 of this example has a gate pad 164. The semiconductor apparatus 100 may have a pad such as an anode pad, a cathode pad, and a current detection pad. Each pad is arranged in a region close to the end side 162. The region close to the end side 162 refers to a region between the end side 162 and the emitter electrode in the top view. When the semiconductor apparatus 100 is mounted, each pad may be connected to an external circuit via wiring such as a wire.

A gate potential is applied to the gate pad 164. The gate pad 164 is electrically connected to a conductive portion of a gate trench portion of the active portion 160. The semiconductor apparatus 100 includes a gate runner that connects the gate pad 164 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 162 of the semiconductor substrate 10 in the top view. The outer circumferential gate runner 130 of this example encloses the active portion 160 in the top view. A region enclosed by the outer circumferential gate runner 130 in the top view may be the active portion 160. Further, the outer circumferential gate runner 130 is connected to the gate pad 164. The outer circumferential gate runner 130 is arranged above the semiconductor substrate 10. The outer circumferential gate runner 130 may be metal wiring including aluminum or the like.

The active-side gate runner 131 is provided in the active portion 160. Providing the active-side gate runner 131 in the active portion 160 can reduce a variation in wiring length from the gate pad 164 for each region of the semiconductor substrate 10.

The active-side gate runner 131 is connected to the gate trench portion of the active portion 160. The active-side gate runner 131 is arranged above the semiconductor substrate 10. The active-side gate runner 131 may be wiring formed of a semiconductor such as polysilicon doped with an impurity.

The active-side gate runner 131 may be connected to the outer circumferential gate runner 130. The active-side gate runner 131 of this example is provided extending in the X axis direction so as to cross the active portion 160 from one outer circumferential gate runner 130 to the other outer circumferential gate runner 130 substantially at the center of the Y axis direction. When the active portion 160 is divided by the active-side gate runner 131, the transistor portion 70 and the diode portion 80 may be alternately arranged in the X axis direction in each divided region.

Further, the semiconductor apparatus 100 may include a temperature sensing portion (not shown) that is a PN junction diode formed of polysilicon or the like, and a current detection portion (not shown) that simulates an operation of the transistor portion provided in the active portion 160.

The semiconductor apparatus 100 of this example includes an edge termination structure portion 90 between the active portion 160 and the end side 162 in the top view. The edge termination structure portion 90 of this example is arranged between the outer circumferential gate runner 130 and the end side 162. The edge termination structure portion 90 reduces an electric field strength on the upper surface side of the semiconductor substrate 10. The edge termination structure portion 90 may include at least one of a guard ring, a field plate, and a RESURF which are annularly provided to enclose the active portion 160.

Figure 2:
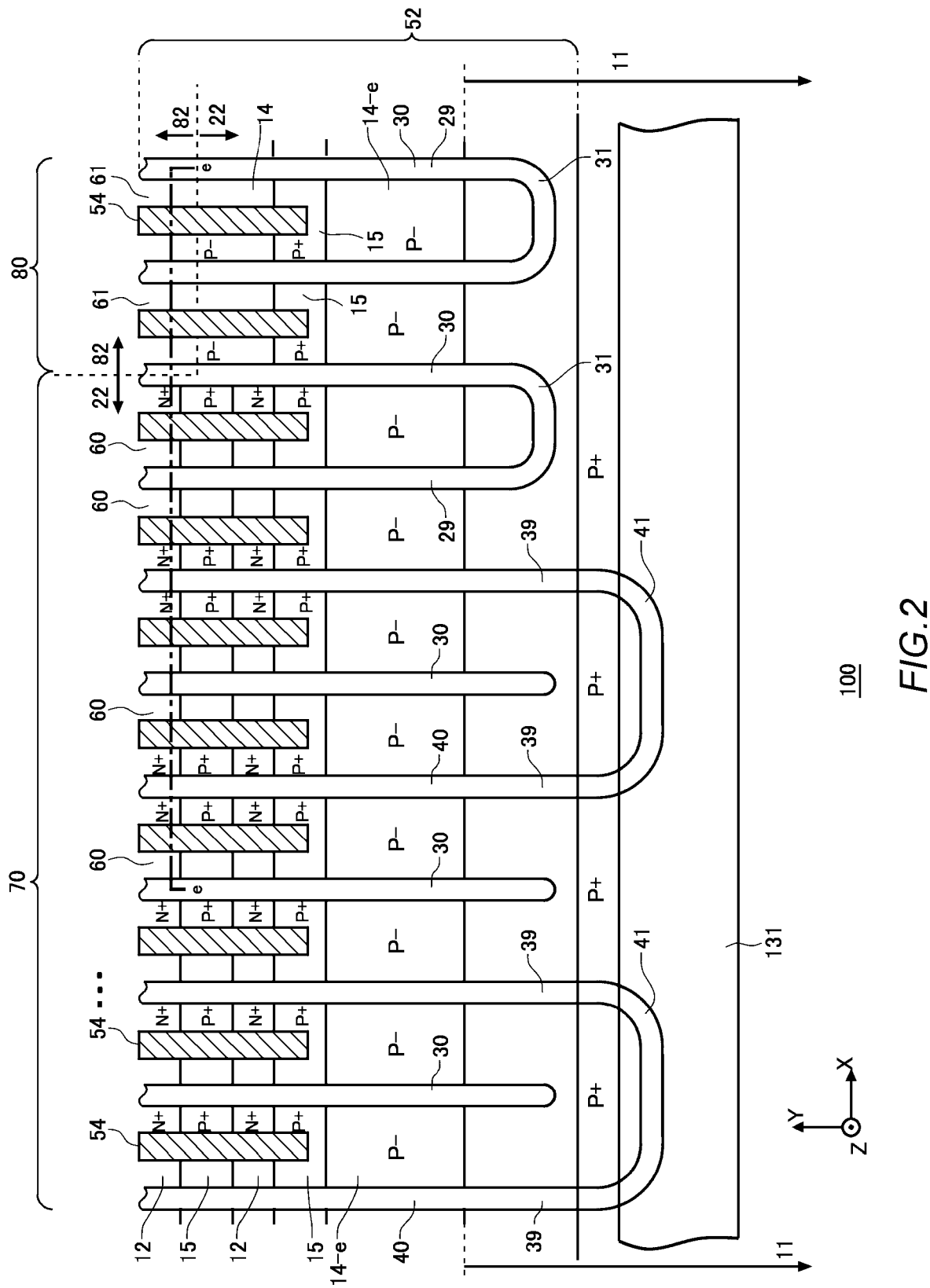
FIG. 2 illustrates an enlarged view of a region D in FIG. 1.

FIG. 2 illustrates an enlarged view of a region D in FIG. 1. The region D is a region including the transistor portion 70, the diode portion 80, and the active-side gate runner 131. The semiconductor apparatus 100 of this example includes a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are an example of the trench portion. Further, the semiconductor apparatus 100 of this example includes an emitter electrode 52 and the active-side gate runner 131 that are provided above the upper surface of the semiconductor substrate 10. The emitter electrode 52 and the active-side gate runner 131 are provided in isolation each other.

An interlayer dielectric film is provided between the emitter electrode 52 and the active-side gate runner 131, and the upper surface of the semiconductor substrate 10, but the interlayer dielectric film is omitted in FIG. 2. In the interlayer dielectric film of this example, a contact hole 54 is provided passing through the interlayer dielectric film. In FIG. 2, each contact hole 54 is hatched with the diagonal lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 on the upper surface of the semiconductor substrate 10, through the contact hole 54. Further, the emitter electrode 52 is connected to a dummy conductive portion in the dummy trench portion 30 through the contact hole provided in the interlayer dielectric film. The emitter electrode 52 may be connected to the dummy conductive portion of the dummy trench portion 30 at an edge of the dummy trench portion 30 in the Y axis direction.

The active-side gate runner 131 is connected to the gate trench portion 40 through the contact hole provided in the interlayer dielectric film. The active-side gate runner 131 may be connected to a gate conductive portion of the gate trench portion 40 at an edge portion 41 of the gate trench portion 40 in the Y axis direction. The active-side gate runner 131 is not connected to the dummy conductive portion in the dummy trench portion 30.

The emitter electrode 52 is formed of a material including a metal. FIG. 2 shows a range where the emitter electrode 52 is provided. For example, at least a part of a region of the emitter electrode 52 is formed of aluminum or an aluminum-silicon alloy, for example, a metal alloy such as AlSi, AlSiCu. The emitter electrode 52 may have a barrier metal formed of titanium, a titanium compound, or the like below a region formed of aluminum or the like. Further, a plug, which is formed by embedding tungsten or the like so as to be in contact with the barrier metal and aluminum or the like, may be included in the contact hole.

The well region 11 is provided overlapping the active-side gate runner 131. The well region 11 is provided so as to extend with a predetermined width even in a range not overlapping the active-side gate runner 131. The well region 11 of this example is provided away from an end of the contact hole 54 in the Y axis direction toward the active-side gate runner 131 side. The well region 11 is a region of a second conductivity type in which the doping concentration is higher than the base region 14. The base region 14 of this example is the P− type, and the well region 11 is the P+ type.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. In the diode portion 80 of this example, the gate trench portion 40 is not provided.

The gate trench portion 40 of this example may have two linear portions 39 extending along the extending direction perpendicular to the array direction (portions of a trench that are linear along the extending direction), and the edge portion 41 connecting the two linear portions 39. The extending direction in FIG. 2 is the Y axis direction.

At least a part of the edge portion 41 is desirably provided in a curved shape in a top view. By connecting between end portions of the two linear portions 39 in the Y axis direction by the edge portion 41, it is possible to reduce the electric field strength at the end portions of the linear portions 39.

In the transistor portion 70, the dummy trench portions 30 are provided between the respective linear portions 39 of the gate trench portions 40. Between the respective linear portions 39, one dummy trench portion 30 may be provided or a plurality of dummy trench portions 30 may be provided. The dummy trench portion 30 may have a linear shape extending in the extending direction, or may have linear portions 29 and an edge portion 31 similar to the gate trench portion 40. The semiconductor apparatus 100 shown in FIG. 2 includes both of the linear dummy trench portion 30 having no edge portion 31, and the dummy trench portion 30 having the edge portion 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 in a top view. In other words, the bottom in the depth direction of each trench portion is covered with the well region 11 at the end portion in the Y axis direction of each trench portion. With this configuration, the electric field strength on the bottom portion of each trench portion can be reduced.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extending direction (the Y axis direction) along the trench, on the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion refers to each of the mesa portion 60 and the mesa portion 61.

Each mesa portion is provided with the base region 14. In the mesa portion, a region arranged closest to the active-side gate runner 131, in the base region 14 exposed on the upper surface of the semiconductor substrate 10, is to be a base region 14-e. While FIG. 2 shows the base region 14-e arranged at one end portion of each mesa portion in the extending direction, the base region 14-e is also arranged at the other end portion of each mesa portion. Each mesa portion may be provided with at least one of the emitter region 12 of a first conductivity type, and the contact region 15 of the second conductivity type in a region sandwiched between the base regions 14-e in the top view. The emitter region 12 of this example is the N+ type, and the contact region 15 is the P+ type. The emitter region 12 and the contact region 15 may be provided between the base region 14 and the upper surface of the semiconductor substrate 10 in the depth direction.

The mesa portion 60 of the transistor portion 70 has the emitter region 12 exposed on the upper surface of the semiconductor substrate 10. The emitter region 12 is provided in contact with the gate trench portion 40. The mesa portion 60 in contact with the gate trench portion 40 may be provided with the contact region 15 exposed on the upper surface of the semiconductor substrate 10.

Each of the contact region 15 and the emitter region 12 in the mesa portion 60 is provided from one trench portion to the other trench portion in the X axis direction. As an example, the contact region 15 and the emitter region 12 in the mesa portion 60 are alternately arranged along the extending direction of the trench portion (the Y axis direction).

In another example, the contact region 15 and the emitter region 12 in the mesa portion 60 may be provided in a stripe shape along the extending direction of the trench portion (the Y axis direction). For example, the emitter region 12 is provided in a region in contact with the trench portion, and the contact region 15 is provided in a region sandwiched between the emitter regions 12.

The mesa portion 61 of the diode portion 80 is not provided with the emitter region 12. The base region 14 and the contact region 15 may be provided on an upper surface of the mesa portion 61. In the region sandwiched between the base regions 14-e on the upper surface of the mesa portion 61, the contact region 15 may be provided in contact with each base region 14-e. The base region 14 may be provided in a region sandwiched between the contact regions 15 on the upper surface of the mesa portion 61. The base region 14 may be arranged in the entire region sandwiched between the contact regions 15.

The contact hole 54 is provided above each mesa portion. The contact hole 54 is arranged in the region sandwiched between the base regions 14-e. The contact hole 54 of this example is provided above respective regions of the contact region 15, the base region 14, and the emitter region 12. The contact hole 54 is not provided in regions corresponding to the base region 14-e and the well region 11. The contact hole 54 may be arranged at the center of the mesa portion 60 in the array direction (the X axis direction).

In the diode portion 80, a cathode region 82 of the N+ type is provided in a region in direct contact with the lower surface of the semiconductor substrate 10. On the lower surface of the semiconductor substrate 10, a collector region of the P+ type 22 may be provided in a region where the cathode region 82 is not provided. The cathode region 82 and the collector region 22 are provided between a lower surface 23 of the semiconductor substrate 10 and a buffer region 20. In FIG. 2, a boundary between the cathode region 82 and the collector region 22 is indicated by a dotted line.

The cathode region 82 is arranged separately from the well region 11 in the Y axis direction. With this configuration, the distance between the region of the P type (the well region 11) having a relatively high doping concentration and formed up to the deep position, and the cathode region 82 is ensured, so that the breakdown voltage can be improved. The end portion in the Y axis direction of the cathode region 82 of this example is arranged farther away from the well region 11 than the end portion in the Y axis direction of the contact hole 54. In another example, the end portion in the Y axis direction of the cathode region 82 may be arranged between the well region 11 and the contact hole 54.

Figure 3:
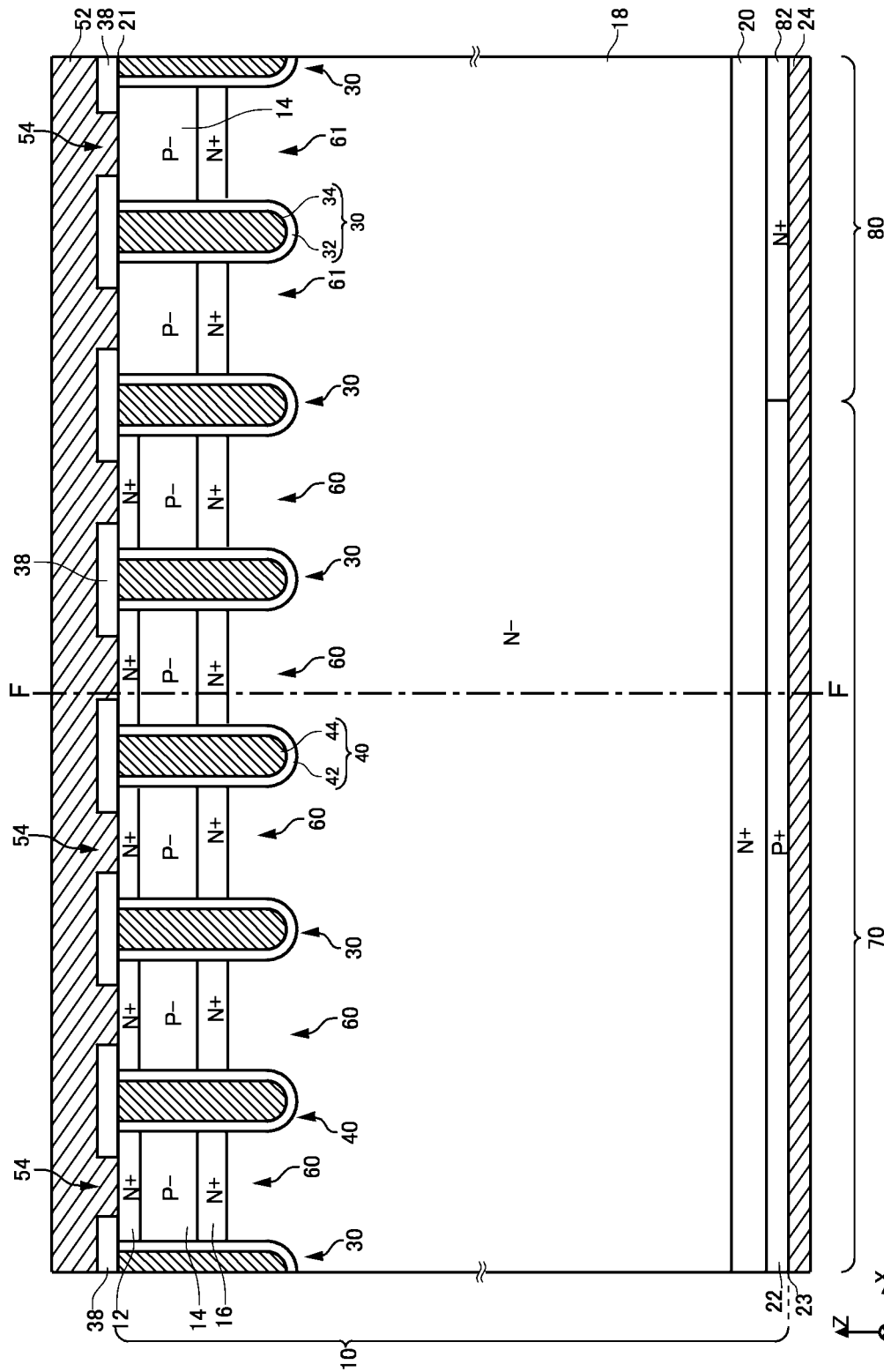
FIG. 3 illustrates a view showing an example of a cross section e-e in FIG. 2.

FIG. 3 illustrates a view showing an example of a cross section e-e in FIG. 2. The cross section e-e is an XZ plane passing through the emitter region 12 and the cathode region 82. The semiconductor apparatus 100 of this example includes the semiconductor substrate 10, the interlayer dielectric film 38, the emitter electrode 52, and the collector electrode 24 in the cross section.

The interlayer dielectric film 38 is provided on the upper surface of the semiconductor substrate 10. The interlayer dielectric film 38 is a film including at least one layer of a dielectric film such as silicate glass to which an impurity such as boron or phosphorous is added, a thermal oxide film, and other dielectric films. The interlayer dielectric film 38 is provided with the contact hole 54 described in FIG. 2.

The emitter electrode 52 is provided on the upper side of the interlayer dielectric film 38. The emitter electrode 52 is in contact with an upper surface 21 of the semiconductor substrate 10 through the contact hole 54 of the interlayer dielectric film 38. The collector electrode 24 is provided on a lower surface 23 of the semiconductor substrate 10. The emitter electrode 52 and the collector electrode 24 are formed of a metal material such as aluminum. In the specification, the direction in which the emitter electrode 52 is connected to the collector electrode 24 (the Z axis direction) is referred to as a depth direction.

The semiconductor substrate 10 includes a drift region 18 of the N type or the N− type. The drift region 18 is provided in each of the transistor portion 70 and the diode portion 80.

In the mesa portion 60 of the transistor portion 70, the emitter region 12 of the N+ type and the base region 14 of the P− type are provided in order from an upper surface 21 side of the semiconductor substrate 10. The drift region 18 is provided below the base region 14. The mesa portion 60 may be provided with an accumulation region 16 of the N+ type. The accumulation region 16 is arranged between the base region 14 and the drift region 18.

The emitter region 12 is exposed on the upper surface 21 of the semiconductor substrate 10 and is provided in contact with gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is the region of the N+ type with a higher doping concentration than the drift region 18. The accumulation region 16 may have a concentration peak of a donor such as a phosphorus or hydrogen donor. By providing the accumulation region 16 having the high concentration between the drift region 18 and the base region 14, it is possible to improve a carrier injection enhancement effect (IE effect) and reduce an on-voltage. The accumulation region 16 may be provided to cover a whole lower surface of the base region 14 in each mesa portion 60.

The mesa portion 61 of the diode portion 80 is provided with the base region 14 of the P− type in contact with the upper surface 21 of the semiconductor substrate 10. The drift region 18 is provided below the base region 14. In the mesa portion 61, the accumulation region 16 may be provided below the base region 14.

In each of the transistor portion 70 and the diode portion 80, the buffer region 20 of the N+ type may be provided below the drift region 18. The doping concentration of the buffer region 20 is higher than the doping concentration of the drift region 18. The buffer region 20 may have a concentration peak having a higher doping concentration than the doping concentration of the drift region 18. The doping concentration of the concentration peak indicates a doping concentration at the local maximum of the concentration peak. Further, as the doping concentration of the drift region 18, an average value of doping concentrations in the region where the doping concentration distribution is substantially flat may be used.

The buffer region 20 may be formed by ion implantation of the dopant of the N type such as hydrogen (proton) or phosphorus. The buffer region 20 of this example is formed by the ion implantation of hydrogen. The buffer region 20 may function as a field stop layer which prevents a depletion layer expanding from the lower end of the base region 14 from reaching the collector region 22 of the P+ type and the cathode region 82 of the N+ type.

In the transistor portion 70, the collector region of the P+ type 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

Below the buffer region 20 in the diode portion 80, the cathode region 82 of the N+ type is provided. A donor concentration of the cathode region 82 is higher than a donor concentration of the drift region 18. A donor of the cathode region 82 is, for example, hydrogen or phosphorous. Note that an element serving as a donor and an acceptor in each region is not limited to the above described example. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

One or more gate trench portions 40 and one or more dummy trench portions 30 are provided on the upper surface 21 side of the semiconductor substrate 10. Each trench portion passes through the base region 14 from the upper surface 21 of the semiconductor substrate 10, and reaches the drift region 18. In a region where at least any one of the emitter region 12, the contact region 15, and the accumulation region 16 is provided, each trench portion also passes through the doping regions of these to reach the drift region 18. The configuration of the trench portion penetrating the doping region is not limited to the one manufactured in the order of forming the doping region and then forming the trench portion. The configuration of the trench portion penetrating the doping region includes a configuration of the doping region being formed between the trench portions after forming the trench portion.

As described above, the transistor portion 70 is provided with the gate trench portion 40 and the dummy trench portion 30. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate dielectric film 42, and a gate conductive portion 44. The gate dielectric film 42 is provided to cover the inner wall of the gate trench. The gate dielectric film 42 may be formed by oxidizing or nitriding a semiconductor on the inner wall of the gate trench. The gate conductive portion 44 is provided inside from the gate dielectric film 42 in the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 is electrically connected to the emitter electrode 52. The dummy dielectric film 32 is provided covering an inner wall of the dummy trench. The dummy conductive portion 34 is provided in the dummy trench, and is provided inside the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered with the interlayer dielectric film 38 on the upper surface 21 of the semiconductor substrate 10. It is noted that the bottoms of the dummy trench portion 30 and the gate trench portion 40 may be formed in a curved-surface shape (a curved-line shape in the cross section) convexly downward.

Figure 4:
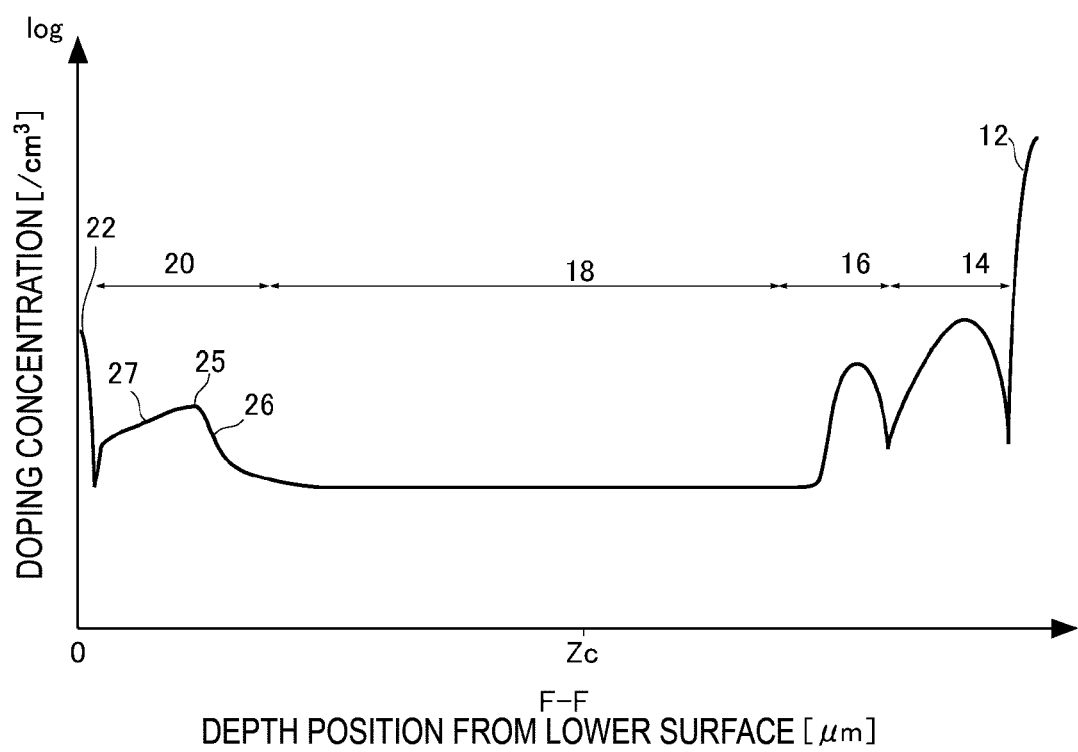
FIG. 4 illustrates a diagram showing an example of a doping concentration distribution in a depth direction, at a position of a line F-F in FIG. 3.

FIG. 4 illustrates a diagram showing an example of a doping concentration distribution in a depth direction, at a position of a line F-F in FIG. 3. A vertical axis of FIG. 4 is a logarithmic axis. In FIG. 4, a center position of the semiconductor substrate 10 in the depth direction is set as Zc.

The emitter region 12 has a concentration peak of the dopant of the N type. The dopant of the N type is, for example, phosphorus, but is not limited to this. The base region 14 has a concentration peak of the dopant of the P type. The dopant of the P type is, for example, boron, but is not limited to this. The accumulation region 16 has a concentration peak of the dopant of the N type. The dopant of the N type is, for example, hydrogen or phosphorus, but is not limited to this.

The drift region 18 may have a flat region where the doping concentration is substantially constant. The flat region is a portion where a region with the doping concentration between a predetermined maximum value max and a predetermined minimum value min is continuous in the depth direction. As the maximum value max, the maximum value of the doping concentration in the region may be used. The minimum value min may be a value of 50% of the maximum value max, or may be a value of 70%, or may be a value of 90%.

Alternatively, in the flat region, a value of the doping concentration distribution may be within ±50% of an average concentration of the doping concentration distribution, with respect to the average concentration of the doping concentration distribution in a predetermined range in the depth direction, may be within ±30%, or may be within ±10%.

The doping concentration distribution in the buffer region 20 of this example has a single concentration peak 25. The buffer region 20 may have a plurality of concentration peaks 25 provided at different positions in the depth direction. When the buffer region 20 has the plurality of concentration peaks 25, the concentration peak 25 described in FIG. 4 and the subsequent drawings is the concentration peak 25 closest to the drift region 18.

The concentration peak 25 of this example is formed by implanting a hydrogen ion from the lower surface 23 of the semiconductor substrate 10. That is, the concentration peak 25 is the concentration peak of the hydrogen donor. The hydrogen ion is implanted near an apex of the concentration peak 25. When the hydrogen ion is implanted from the lower surface 23, the hydrogen is also distributed in a region from the apex of the concentration peak 25 to the lower surface 23. On the other hand, almost no hydrogen is distributed on the upper surface 21 side from the apex of the concentration peak 25. Therefore, a gradient of a lower surface side slope 27 from the apex of the concentration peak 25 toward the lower surface 23 becomes gentle, and a gradient of an upper surface side slope 26 from the apex of the concentration peak 25 toward the upper surface 21 becomes steeper than that of the lower surface side slope 27.

The upper surface side slope 26 of this example is a deepest slope in which the doping concentration monotonically decreases to a position where it comes in contact with the drift region 18, in a direction from the lower surface 23 of the semiconductor substrate 10 toward the upper surface 21. The monotonic decrease means that the doping concentration does not increase in the direction from the lower surface 23 to the upper surface 21. That is, at each position of the upper surface side slope 26, the doping concentration decreases or is the same in comparison with that of an adjacent position on a lower surface 23 side.

The upper surface side slope 26 of this example is provided from the apex of the concentration peak 25 to a lower end of the drift region 18. A boundary between the drift region 18 and the upper surface side slope 26 may be a lower end of the flat region of the drift region 18 described above. The boundary may be a position, between the upper surface side slope 26 and the drift region 18, where the doping concentration matches an average value of the doping concentration in the flat region of the drift region 18, or may be a position where the doping concentration is 1.5 times the average value.

When the semiconductor substrate 10 is irradiated with charged particles such as the hydrogen ions, lattice defects mainly composed of vacancies, such as monatomic vacancies (V) and diatomic vacancies (VV), are formed in a passed-through region through which the charged particles have passed by the passage of the charged particles. In this example, the lattice defects are formed in a region from the lower surface 23 of the semiconductor substrate 10 near the apex of the concentration peak 25. An atom adjacent to the vacancy has a dangling bond. The lattice defects include interstitial atoms, dislocations, or the like, and may also include donors and acceptors in a broad sense; however, in the present specification, the lattice defects mainly composed of vacancies may be referred to as vacancy type lattice defects, vacancy type defects, or simply the lattice defects. Further, crystallinity of the semiconductor substrate 10 may be strongly disturbed due to the formations of many lattice defects by the charged particles being implanted into the semiconductor substrate 10. In the present specification, this disturbance of the crystallinity may be referred to as the disorder.

Further, oxygen is contained in the entire semiconductor substrate 10. The oxygen is intentionally or unintentionally introduced during manufacturing of semiconductor ingots. When the hydrogen implanted into the buffer region 20 is diffused by heat treatment or the like, the hydrogen (H), the vacancy (V), and the oxygen (O) are combined inside the semiconductor substrate 10, and the VOH defect is formed.

The VOH defect functions as the donor that supplies the electrons. In the present specification, the VOH defect may be simply referred to as the hydrogen donor. By forming the hydrogen donor in the semiconductor substrate 10, the buffer region 20 having a concentration higher than that of the drift region 18 can be formed.

Figure 5:
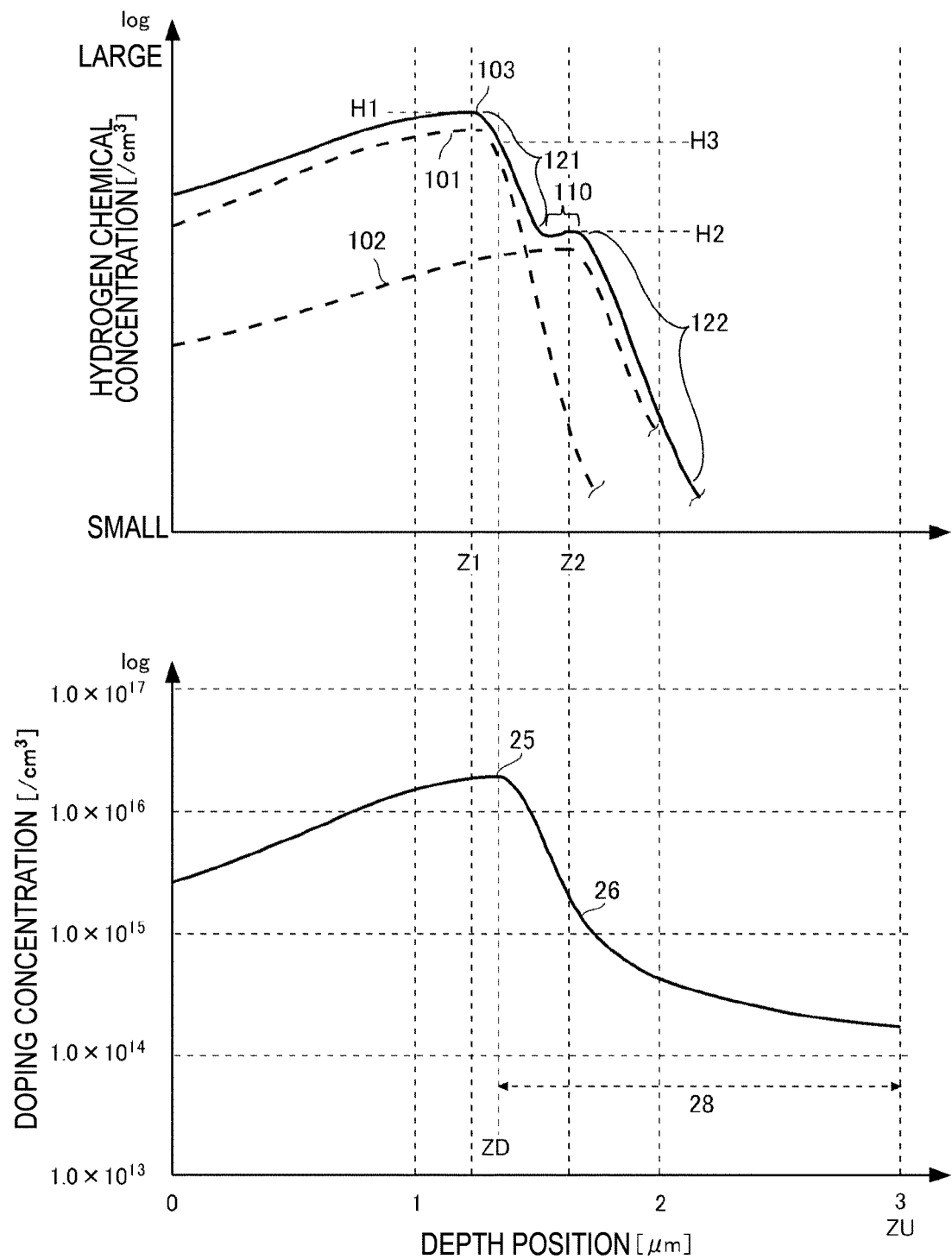
FIG. 5 illustrates a diagram showing distribution examples of a doping concentration and a hydrogen chemical concentration in a buffer region 20.

FIG. 5 illustrates a diagram showing distribution examples of a doping concentration and a hydrogen chemical concentration in a buffer region 20. In FIG. 5, a horizontal axis indicates a distance (a depth position) from a lower end of the buffer region 20.

The doping concentration distribution is similar to that of the example described in FIG. 4. In FIG. 5, a depth range in which the upper surface side slope 26 (the deepest slope) is provided is set as a first depth range 28. A lower end position of the first depth range 28 is set as a position ZD, and an upper end position is set as a position ZU. The position ZD is a position of the apex of the concentration peak 25. The position ZU is a boundary between the drift region 18 and the upper surface side slope 26.

The hydrogen chemical concentration distribution has one or more peaks outside the first depth range 28. Among the peaks, a peak closest to the lower end position ZD is set as a lower end peak 103. An apex of the lower end peak 103 is arranged at a depth position Z1. The depth position Z1 may be arranged between the lower end position ZD and the lower surface 23. The depth position Z1 may be the same position as the lower end position ZD.

The hydrogen chemical concentration distribution has, inside the first depth range 28, a first decrease portion 121 in which a hydrogen chemical concentration decreases toward the upper surface 21 side. The hydrogen chemical concentration distribution has a second decrease portion 122 inside the first depth range 28. The second decrease portion 122 is located to be closer to the upper surface 21 side than the first decrease portion 121 is, and is a region in which the hydrogen chemical concentration monotonically decreases toward the upper surface 21 side. The hydrogen chemical concentration distribution has an intermediate portion 110 between the first decrease portion 121 and the second decrease portion 122. That is, the hydrogen chemical concentration distribution has the intermediate portion 110 at a position overlapping the upper surface side slope 26. The intermediate portion 110 is a region where the hydrogen chemical concentration distribution has a peak in a slope, a flat portion 114, or a kink portion 115, described below. A hydrogen chemical concentration H2 in the intermediate portion 110 is smaller than a hydrogen chemical concentration H1 in the lower end peak 103. The hydrogen chemical concentration H2 in the intermediate portion 110 may be a maximum value of the hydrogen chemical concentration in the intermediate portion 110. The hydrogen chemical concentration H2 may be half or less of the hydrogen chemical concentration H1, may be 40% or less, may be 30% or less, or may be 20% or less. The hydrogen chemical concentration H2 may be 5% or more of the hydrogen chemical concentration H1, may be 10% or more, or may be 20% or more.

Further, the hydrogen chemical concentration at the position ZD is set as H3. The hydrogen chemical concentration H3 is larger than the hydrogen chemical concentration H2. The hydrogen chemical concentration H2 may be half or less of the hydrogen chemical concentration H3, may be 40% or less, may be 30% or less, or may be 20% or less. The hydrogen chemical concentration H2 may be 5% or more of the hydrogen chemical concentration H3, may be 10% or more, or may be 20% or more.

In this example, the hydrogen ions are implanted at a plurality of depth positions (Z1 and Z2 in FIG. 5) of the buffer region 20. The buffer region 20 has the hydrogen chemical concentration distribution obtained by adding the chemical concentration distribution of the hydrogen implanted at each position. In FIG. 5, the chemical concentration distribution of the hydrogen implanted at the position Z1 is set as a distribution 101. Further, the chemical concentration distribution of the hydrogen implanted at the position Z2 is set as a distribution 102. The buffer region 20 has the hydrogen chemical concentration distribution obtained by adding the distribution 101 and the distribution 102.

When the hydrogen ion is not implanted at the position Z2, the gradient of the upper surface side slope 26 of the concentration peak 25 has approximately the same degree as a gradient of an upper surface side slope of the distribution 101. In this case, the gradient of the upper surface side slope 26 becomes steep. At the time or the like of turn off of the semiconductor apparatus 100, the depletion layer extends from the lower end of the base region 14 toward the buffer region 20. At this time, in a case where the gradient of the upper surface side slope 26, which is the deepest slope, is steep, a waveform of a voltage or a current easily oscillates when the depletion layer reaches the upper surface side slope 26.

In this example, the hydrogen ion is also implanted at the position Z2 which is closer to the upper surface 21 side than the position Z1 is. This makes it possible for the gradient of the upper surface side slope of the hydrogen chemical concentration distribution to be gentle, and makes it possible for the gradient of the upper surface side slope 26 of the concentration peak 25 to be gentle as well.

Note that when the position Z2 is too far from the position Z1, the distribution 101 and the distribution 102 exist independently of each other, and thus it is not possible for the gradient of the upper surface side slope 26 to be gentle. Further, when a dose amount of the hydrogen ion implanted at the position Z2 is too high or too low, it is not possible for the gradient of the upper surface side slope 26 to be gentle. By reducing a distance between the position Z1 and the position Z2 for the hydrogen chemical concentration distribution to have the intermediate portion 110 in the first depth range 28, and by adjusting the dose amount of the position Z2, it is possible for the gradient of the upper surface side slope 26 to be gentle, and it is possible to suppress an oscillation of the waveform of the current.

A length of the upper surface side slope 26 in the depth direction is 5 µm or less. The length may be 3 µm or less, or may be 2 µm or less. The length may be 0.4 µm or more, may be 1.0 µm or more, or may be 1.5 µm or more. A doping concentration at a lower end of the upper surface side slope 26 may be 10 times or more of the doping concentration of the drift region 18, or may be 50 times or more, or may be 100 times or more.

Figure 6:
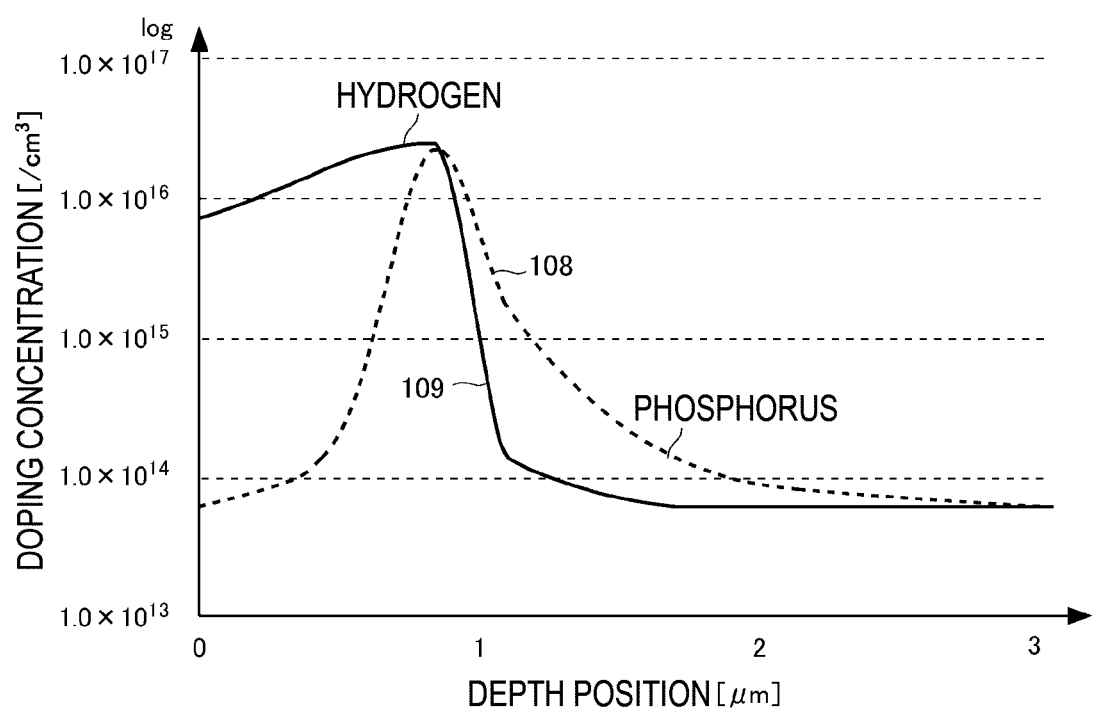
FIG. 6 illustrates a distribution of the doping concentration in the buffer region 20 according to a comparison example

FIG. 6 illustrates a distribution of the doping concentration in the buffer region 20 according to a comparison example FIG. 6 shows the doping concentration distribution when a phosphorus ion is implanted to form a buffer region 20, and the doping concentration distribution when the hydrogen ion is implanted at a single depth position to form the buffer region 20.

When the phosphorus is implanted from the lower surface 23 to be diffused, it is possible for a gradient of an upper surface side slope 108 of the concentration peak to be gentle. On the other hand, the hydrogen donor is not formed in a region through which the phosphorus has passed, it is difficult to form a high concentration region over a wide range.

When the hydrogen ion is implanted at a single depth position from the lower surface 23 to be diffused, the hydrogen donor is formed in a region through which the hydrogen ion passes, and thus it is possible to form the high concentration region from the lower surface 23 to the implantation position. On the other hand, even when there are few lattice defects in a region deeper than the implantation position, and the hydrogen is diffused, the concentration of the hydrogen donor that is formed may be small. Therefore, a gradient of an upper surface side slope 109 becomes steep. At this time, in a case where the gradient of the upper surface side slope 109, which is the deepest slope, is steep, a waveform of a voltage or a current easily oscillates when the depletion layer reaches the upper surface side slope 109. On the other hand, with the example shown in FIG. 5, it is possible for the gradient of the upper surface side slope 26 to be gentle by implanting the hydrogen ions at the position Z1 and the nearby position Z2.

Figure 7:
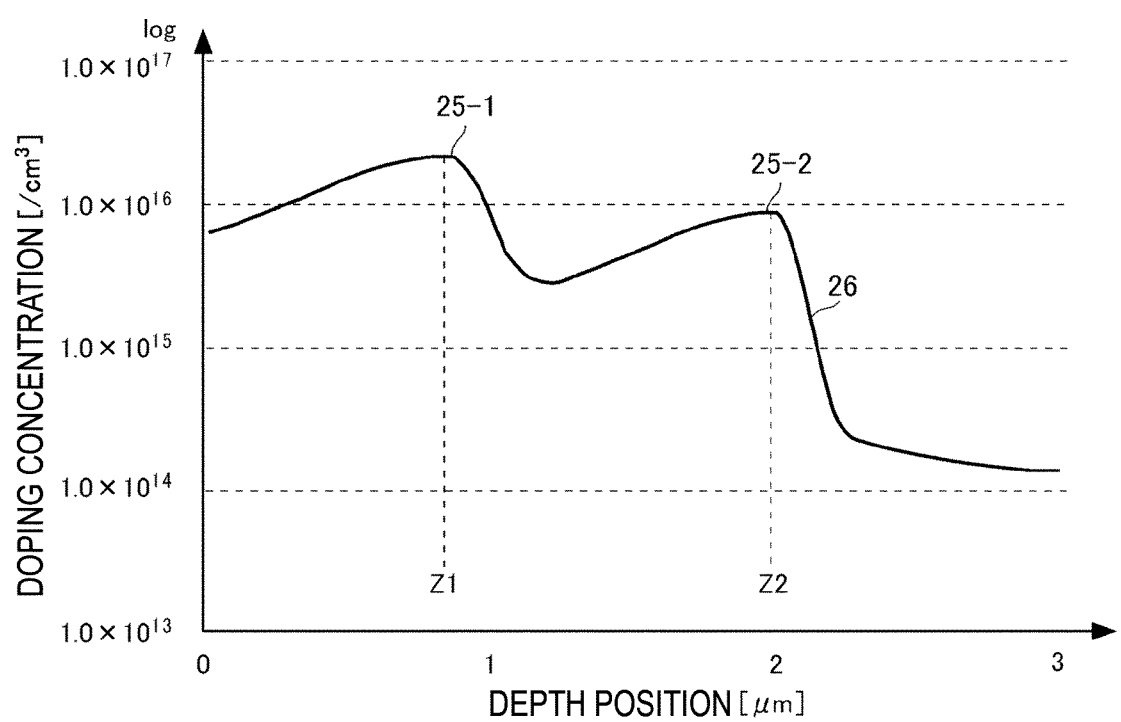
FIG. 7 illustrates a distribution of the doping concentration in the buffer region 20 according to a comparison example

FIG. 7 illustrates a distribution of the doping concentration in the buffer region 20 according to a comparison example. In this example, the hydrogen ions are implanted at the two depth positions (Z1, Z2) to form the buffer region 20. In this example, the distance between the depth position Z1 and the depth position Z2 is comparatively large. Therefore, the doping concentration distribution of the buffer region 20 has the concentration peak 25 (25-1, 25-2) at each of the depth position Z1 and the depth position Z2. In this case, it is not possible for the gradient of the upper surface side slope 26, which is closest to the drift region 18, to be gentle.

On the other hand, with the example of FIG. 5, it is possible for the gradient of the upper surface side slope 26 to be gentle by implanting the hydrogen ions at the position Z1 and the nearby position Z2. The distance between the position Z1 and the position Z2 may be 0.1 µm or more and 3 µm or less. The distance between the position Z1 and the position Z2 may be 2 µm or less, or may be 1.5 µm or less. The distance between the position Z1 and the position Z2 may be 0.3 µm or more, or may be 0.5 µm or more. The position Z1 may be the position of the apex of the lower end peak 103. The position Z2 may be a position of an apex of the second curved portion 113.

Figure 8:
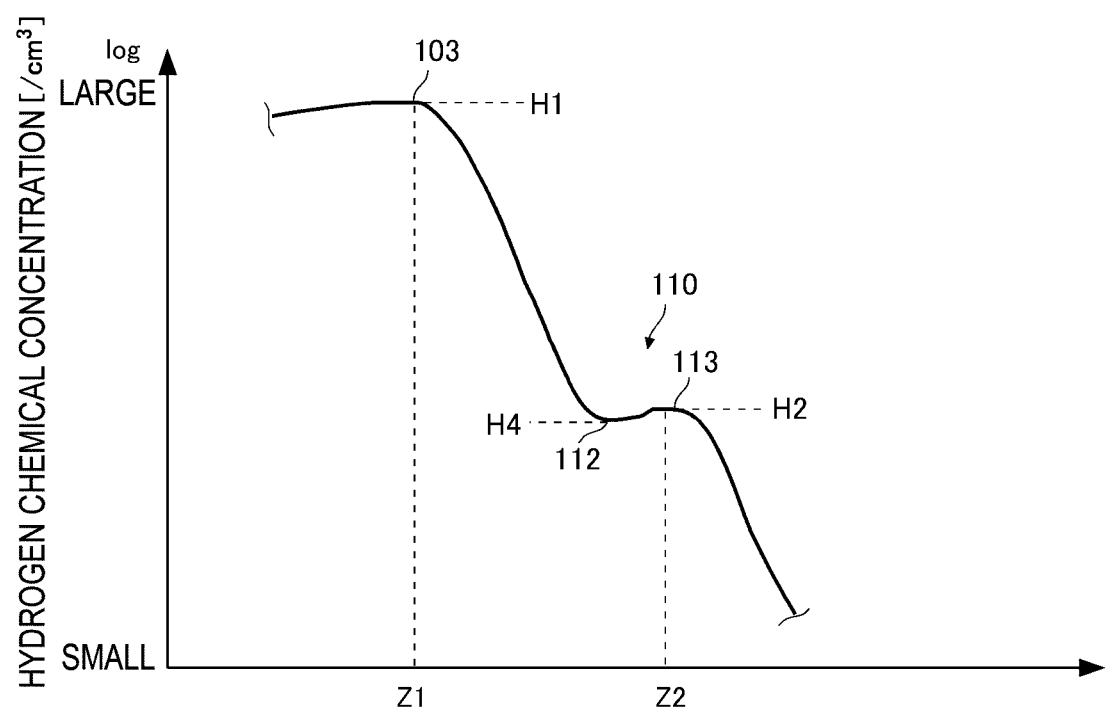
FIG. 8 illustrates a diagram showing an example of a hydrogen chemical concentration distribution in the buffer region 20.

FIG. 8 illustrates a diagram showing an example of a hydrogen chemical concentration distribution in the buffer region 20. FIG. 8 shows the hydrogen chemical concentration distribution near the position Z1 and the position Z2. The intermediate portion 110 of this example has a first curved portion 112 and the second curved portion 113. In the hydrogen chemical concentration distribution, the first curved portion 112 is a downwardly recessed portion, and the second curved portion 113 is an upwardly protruding portion. The first curved portion 112 is arranged between the position Z1 and the drift region 18. The first curved portion 112 is a curved portion different from the lower end peak 103. The second curved portion 113 is arranged between the first curved portion 112 and the drift region 18. The second curved portion 113 is a curved portion different from a curved portion at the boundary between the drift region 18 and the buffer region 20.

In this example, the first curved portion 112 is a valley portion where the hydrogen chemical concentration shows a local minimum value H4. Further, the second curved portion 113 is a peak where the hydrogen chemical concentration shows a local maximum value H2. In the present specification, the second curved portion 113 may be referred to as the peak in a slope. A region from the first curved portion 112 to the second curved portion 113 may be the intermediate portion 110.

Figure 9:
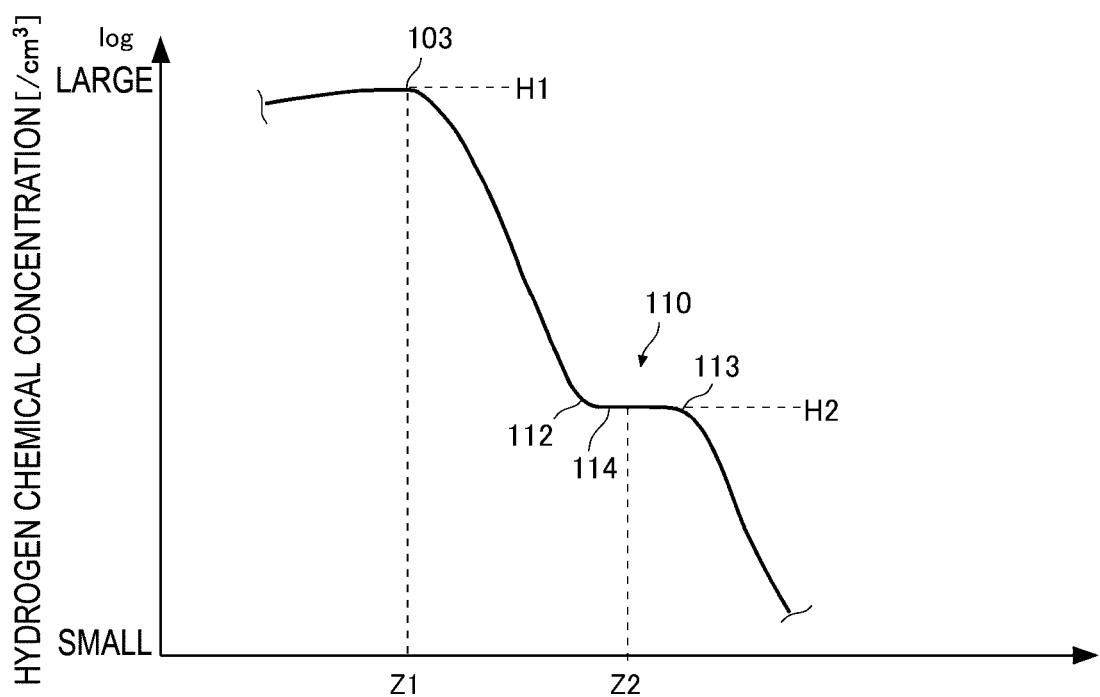
FIG. 9 illustrates a diagram showing another example of the hydrogen chemical concentration distribution in the buffer region 20.

FIG. 9 illustrates a diagram showing another example of the hydrogen chemical concentration distribution in the buffer region 20. FIG. 9 shows the hydrogen chemical concentration distribution near the position Z1 and the position Z2. The intermediate portion 110 of this example has the first curved portion 112 and the second curved portion 113 similarly to the example of FIG. 8. Note that the first curved portion 112 does not show a local minimum value, and the second curved portion 113 does not show a local maximum value.

In this example, a region between the first curved portion 112 and the second curved portion 113 is referred to as the flat portion 114. The flat portion 114 is a region in which the hydrogen chemical concentration distribution is uniform. The region in which the hydrogen chemical concentration distribution is uniform is, for example, a region where a variation of the hydrogen chemical concentration is ±10% or less. In the flat portion 114, the hydrogen chemical concentration distribution does not increase from the lower surface 23 to the upper surface 21. Further, when the hydrogen chemical concentration distribution is differentiated at the depth position from the lower surface 23 toward the upper surface 21, a region where a differential function shows substantially 0 between the first curved portion 112 and the second curved portion 113 may be set as the flat portion 114. A gradient of the flat portion 114 is gentler than any of the hydrogen chemical concentration distribution between the flat portion 114 and the position Z1, and the hydrogen chemical concentration distribution between the flat portion 114 and the drift region 18. In the flat portion 114 of this example, the hydrogen chemical concentration shows a constant value. Further, the gradient of the flat portion 114 may be gentler than a gradient of the doping concentration distribution at the same depth position as that of the flat portion 114.

Figure 10:
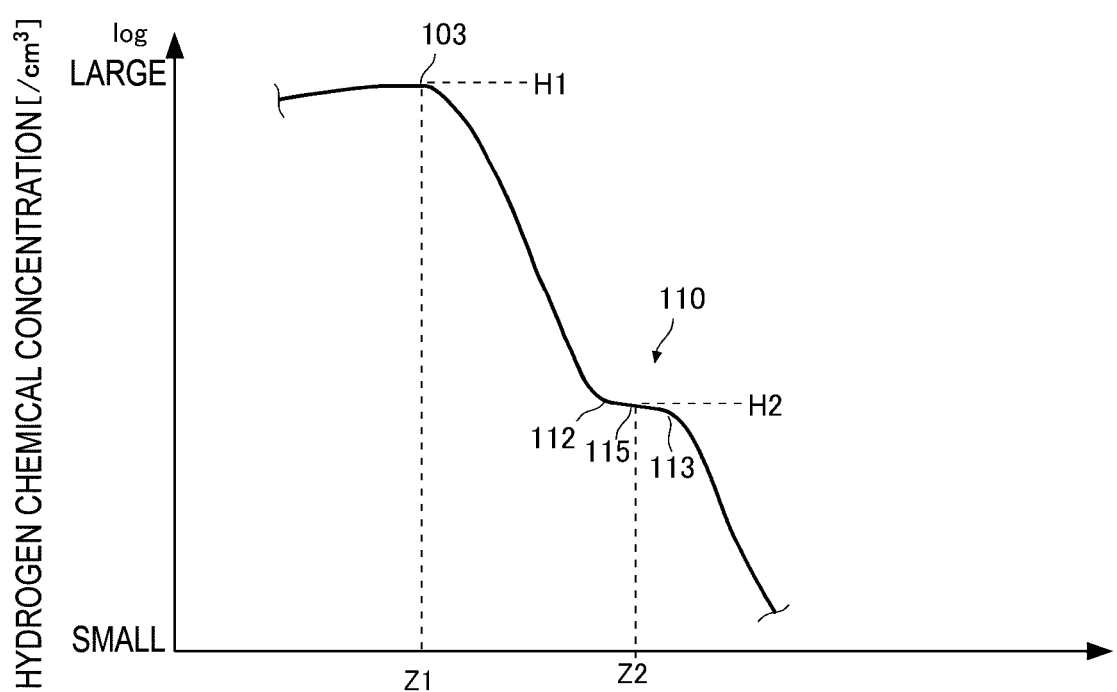
FIG. 10 illustrates a diagram showing another example of the hydrogen chemical concentration distribution in the buffer region 20.

FIG. 10 illustrates a diagram showing another example of the hydrogen chemical concentration distribution in the buffer region 20. FIG. 10 shows the hydrogen chemical concentration distribution near the position Z1 and the position Z2. The intermediate portion 110 of this example has the first curved portion 112 and the second curved portion 113 similarly to the example of FIG. 9. In this example, a region between the first curved portion 112 and the second curved portion 113 is referred to as the kink portion 115. In the kink portion 115 of this example, the hydrogen chemical concentration distribution decreases monotonically from the lower surface 23 to the upper surface 21. Other characteristics of the kink portion 115 are the same as those of the flat portion 114 in FIG. 9. The kink portion 115 is a region where a second derivative becomes 0 without a gradient of the hydrogen chemical concentration distribution becoming 0 or more.

Figure 11:
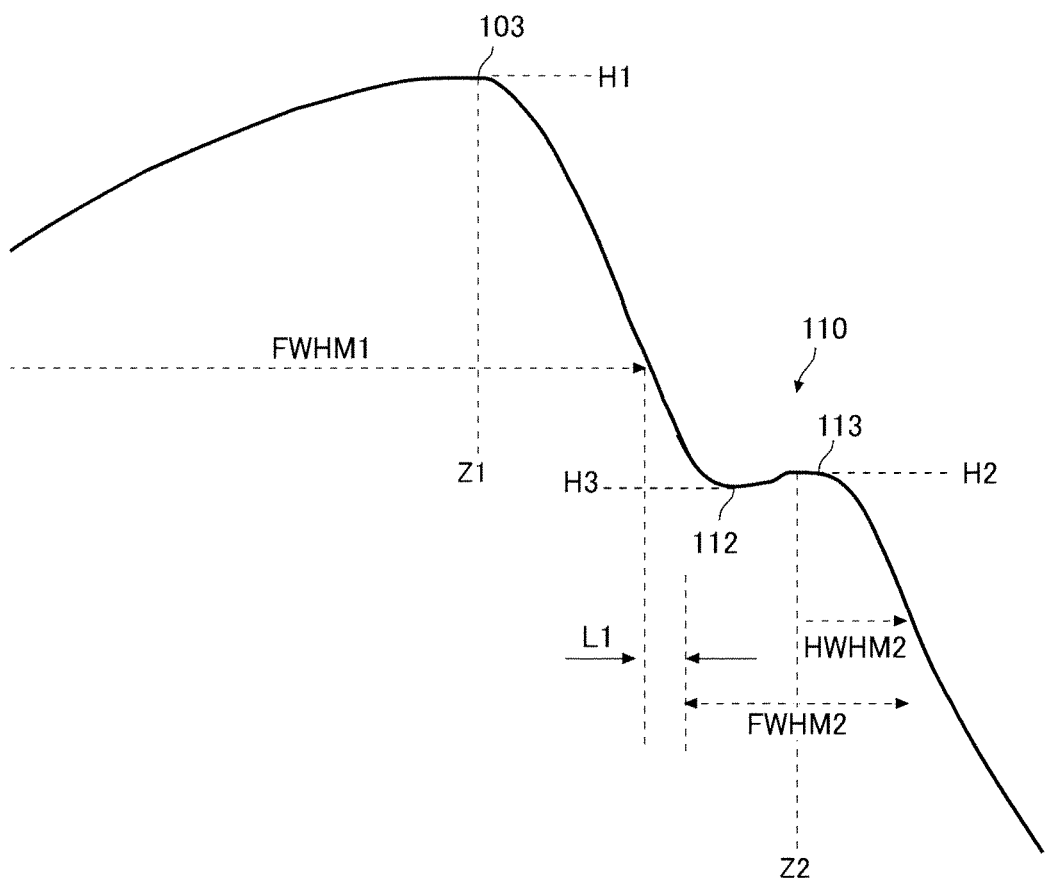
FIG. 11 illustrates a diagram showing an example of a full width at half maximum FWHM of a lower end peak 103 and a second curved portion 113.

FIG. 11 illustrates a diagram showing an example of a full width at half maximum FWHM of a lower end peak 103 and a second curved portion 113. The second curved portion 113 of this example is the peak in a slope. Further, the first curved portion 112 is the valley portion.

A full width at half maximum FWHM1 of the lower end peak 103 of this example, and a full width at half maximum FWHM2 of the second curved portion 113 are separated by a distance L1. The distance L1 may be smaller than any of the full width at half maximum FWHM1, and the full width at half maximum FWHM2. The distance L1 may be smaller than any of half of the full width at half maximum FWHM1, and half of the full width at half maximum FWHM2.

Note that when the local minimum value H3 of the hydrogen chemical concentration in the first curved portion 112 is larger than half of the doping concentration H2 at the apex of the second curved portion 113, it is not possible to determine a lower end position of the full width at half maximum FWHM2 of the second curved portion 113. In this case, a half width at half maximum HWHM2 on an upper side (a drift region 18 side) of the second curved portion 113 may be measured. A size of a half width at half maximum on a lower side (a lower end peak 103 side) of the second curved portion 113 may be set to be the same as the size of the measured half width at half maximum HWHM2. That is, the width of the full width at half maximum FWHM2 may be set to be double the half width at half maximum HWHM2.

The distance L1 between the full width at half maximum FWHM1 and the full width at half maximum FWHM2 can be controlled by the positions Z1 and Z2 for implanting the hydrogen ions. With this example, the distance L1 is comparatively small, and thus the distribution 101 and the distribution 102 shown in FIG. 5 can be added together for the gradient of the upper surface side slope 26 of the concentration peak 25 to be gentle.

Figure 12:
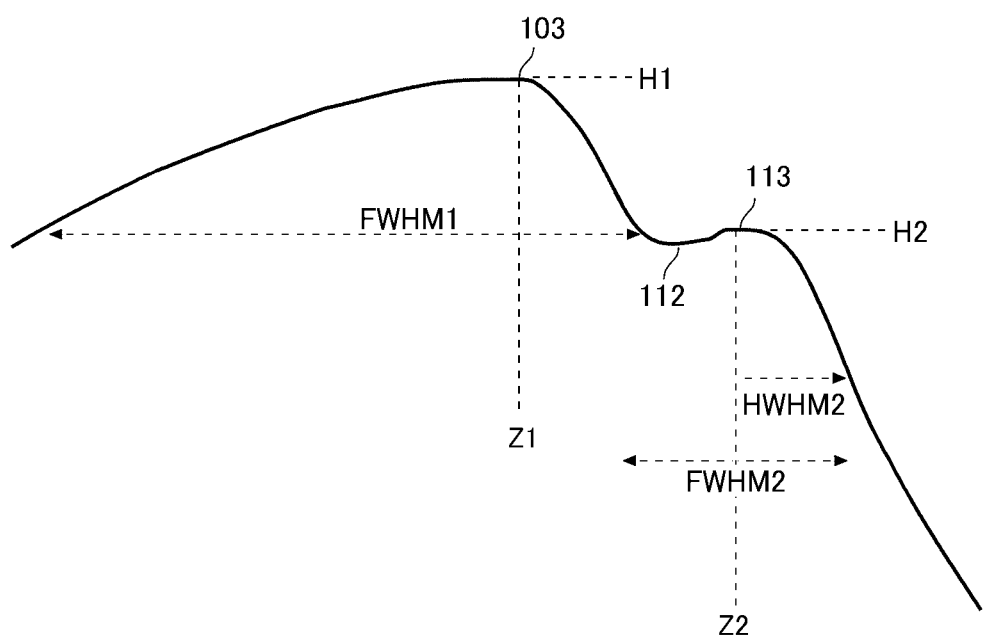
FIG. 12 illustrates a diagram showing another example of the full width at half maximum FWHM of the lower end peak 103 and the second curved portion 113.

FIG. 12 illustrates a diagram showing another example of the full width at half maximum FWHM of the lower end peak 103 and the second curved portion 113. The second curved portion 113 of this example is the peak in a slope. Further, the first curved portion 112 is the valley portion.

The full width at half maximum FWHM1 of the lower end peak 103 of this example, and the full width at half maximum FWHM2 of the second curved portion 113 may be in contact with each other at the end portions, or may partially overlap. Thereby, the distribution 101 and the distribution 102 shown in FIG. 5 can be added together for the gradient of the upper surface side slope 26 of the concentration peak 25 to be gentle.

Note that between the lower end peak 103 and the second curved portion 113, an apex of a peak of one may be arranged outside a range of the full width at half maximum of a peak of the other. This prevents the distribution 102 from being buried in the distribution 101 shown in FIG. 5. Therefore, it is possible for the gradient of the upper surface side slope 26 of the concentration peak 25 to be gentle.

In any of the examples of FIG. 1 to FIG. 12, both of the lower end peak 103 and the second curved portion 113 may have distances of 10 µm or less from the lower surface 23. The distance may be 8 µm or less, or may be 6 µm or less.

Figure 13:
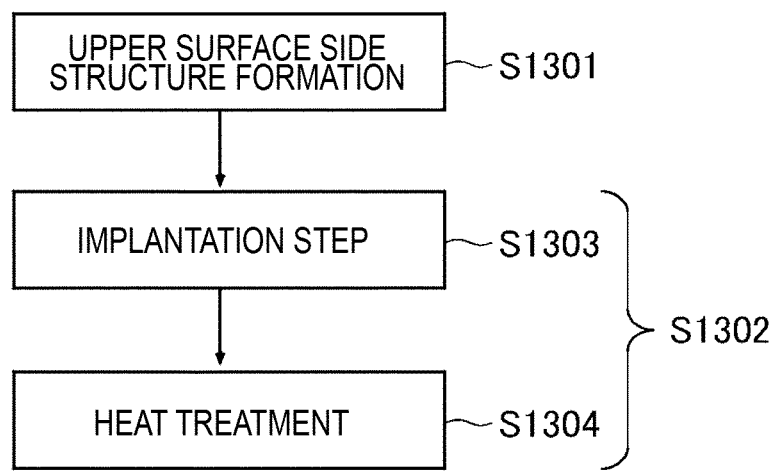
FIG. 13 illustrates a diagram showing some steps of manufacturing steps of the semiconductor apparatus 100.

FIG. 13 illustrates a diagram showing some steps of manufacturing steps of the semiconductor apparatus 100. A manufacturing method for this example has an upper surface side structure formation step S1301 and a buffer formation step S1302. The buffer formation step S1302 has an implantation step S1303 and a heat treatment step S1304.

In the upper surface side structure formation step S1301, a structure on the upper surface 21 side of the semiconductor substrate 10 is formed. The semiconductor substrate 10 may be the substrate of the N type. In this case, a remaining region where another region is not formed becomes the drift region 18. The structure on the upper surface 21 side may refer to a structure on the upper surface 21 side from the center of the semiconductor substrate 10 in the depth position. The structure on the upper surface 21 side includes, for example, the emitter region 12, the base region 14, the accumulation region 16, the trench portion, or the like. The structure on the upper surface 21 side may include each dielectric film such as the interlayer dielectric film 38 arranged above the upper surface 21 of the semiconductor substrate 10, and each conductive member such as the emitter electrode 52.

In the implantation step S1303, the hydrogen ions are implanted, from the lower surface 23 of the semiconductor substrate 10, at at least two depth positions in a region where the buffer region 20 is to be formed. In this example, the hydrogen ions are implanted at the position Z1 at the lower end of the first depth range 28 in contact with the drift region 18, and the predetermined depth position Z2 in the first depth range 28.

A second dose amount (ions/cm$^2$) of the hydrogen ion implanted at the position Z2 is smaller than a first dose amount (ions/cm$^2$) of the hydrogen ion implanted at the position Z1. The second dose amount may be half or less of the first dose amount, may be 40% or less, may be 30% or less, or may be 20% or less. The second dose amount may be 5% or more of the first dose amount, may be 10% or more, or may be 20% or more.

Next, the semiconductor substrate 10 is heat-treated in the heat treatment step S1304. Thereby, the hydrogen donor is formed in the buffer region 20, and the buffer region 20 has the doping concentration distribution described in FIG. 4 to FIG. 12.

Before the heat treatment step S1304, the lower surface 23 of the semiconductor substrate 10 may be ground to adjust a thickness of the semiconductor substrate 10. Before or after the heat treatment step S1304, the collector region 22 and the cathode region 82 may be formed. The collector electrode 24 may be formed after the heat treatment step S1304. Such steps make it possible for the semiconductor apparatus 100 to be manufactured.

While the embodiments of the present invention have been described, the technical scope of the invention is not limited to the above described embodiments. It is apparent to persons skilled in the art that various alterations and improvements can be added to the above described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor apparatus comprising:
   a semiconductor substrate that has an upper surface and a lower surface and that is provided with a drift region of a first conductivity type; and
   a buffer region of the first conductivity type that is arranged between the drift region and the lower surface and that has a concentration higher than that of the drift region, wherein
   a doping concentration distribution in the buffer region has a deepest slope in which a doping concentration monotonically decreases to a position where it comes in contact with the drift region in a direction from the lower surface of the semiconductor substrate toward the upper surface,
   a hydrogen chemical concentration distribution in the buffer region includes in a first depth range provided with the deepest slope:
      a first decrease portion in which a hydrogen chemical concentration decreases toward the upper surface side;
      a second decrease portion which is located to be closer to the upper surface side than the first decrease portion is and in which the hydrogen chemical concentration decreases; and
      an intermediate portion arranged between the first decrease portion and the second decrease portion, and
   the intermediate portion has:
      a flat portion in which the hydrogen chemical concentration distribution is uniform;
      a peak in a slope of the hydrogen chemical concentration; or
      a kink portion of the hydrogen chemical concentration.

2. The semiconductor apparatus according to claim 1, wherein
   a length of the deepest slope in a depth direction is 5 μm or less.

3. The semiconductor apparatus according to claim 2, wherein
   the hydrogen chemical concentration distribution in the buffer region has the peak in a slope in the first depth range.

4. The semiconductor apparatus according to claim 1, wherein
   the hydrogen chemical concentration distribution in the buffer region has the peak in a slope in the first depth range.

5. The semiconductor apparatus according to claim 4, wherein
   the hydrogen chemical concentration distribution in the buffer region includes a lower end peak arranged closest to a lower end of the first depth range outside the first depth range, and
   a full width at half maximum of the peak in a slope and a full width at half maximum of the lower end peak overlap each other.

6. The semiconductor apparatus according to claim 5, wherein
   for the peak in a slope and the lower end peak, an apex of one of the peaks is arranged outside a range of the full width at half maximum of another of the peaks.

7. The semiconductor apparatus according to claim 5, wherein
   a distance between the apex of the peak in a slope and the apex of the lower end peak is 0.1 μm or more and 3 μm or less.

8. The semiconductor apparatus according to claim 5, wherein
   both of the peak in a slope and the lower end peak have distances of 10 μm or less from the lower surface of the semiconductor substrate.

9. The semiconductor apparatus according to claim 4, wherein
   the hydrogen chemical concentration distribution in the buffer region includes a lower end peak arranged closest to a lower end of the first depth range outside the first depth range, and
   a distance between a full width at half maximum of the peak in a slope and a full width at half maximum of the lower end peak is smaller than any of the full widths at half maximum.

10. The semiconductor apparatus according to claim 1, wherein
    the hydrogen chemical concentration distribution in the buffer region has the flat portion in the first depth range, and
    a gradient of the hydrogen chemical concentration distribution is gentler than a gradient of the doping concentration distribution, at a same depth position as that of the flat portion of the hydrogen chemical concentration distribution.

11. The semiconductor apparatus according to claim 1, wherein
    a length of the deepest slope in the depth direction of the semiconductor substrate is 0.4 μm or more.

12. The semiconductor apparatus according to claim 1, wherein
    a hydrogen chemical concentration of the intermediate portion in the hydrogen chemical concentration distribution is lower than or equal to half of a hydrogen chemical concentration at an apex of the deepest slope.

13. The semiconductor apparatus according to claim 1, wherein
    the first depth range includes a doping concentration decrease portion in which a doping concentration decreases, at each position of the semiconductor substrate in the depth direction, in comparison with that at an adjacent position on the lower surface side of the semiconductor substrate, and
    the flat portion, the peak in a slope, or the kink portion is arranged in the doping concentration decrease portion.

14. The semiconductor apparatus according to claim 1, wherein
the hydrogen chemical concentration distribution in the buffer region includes a lower end peak arranged between a lower end position of the deepest slope and the lower surface of the semiconductor substrate.

\* \* \* \* \*